US010269404B2

(12) United States Patent
Fujita

(10) Patent No.: US 10,269,404 B2
(45) Date of Patent: *Apr. 23, 2019

(54) RESISTANCE CHANGE MEMORY

(71) Applicant: TOSHIBA MEMORY CORPORATION, Minato-ku, Tokyo (JP)

(72) Inventor: Katsuyuki Fujita, Seoul (KR)

(73) Assignee: TOSHIBA MEMORY CORPORATION, Tokyo (JP)

(*) Notice: Subject to any disclaimer, the term of this patent is extended or adjusted under 35 U.S.C. 154(b) by 0 days.

This patent is subject to a terminal disclaimer.

(21) Appl. No.: 15/727,053

(22) Filed: Oct. 6, 2017

(65) Prior Publication Data

US 2018/0033475 A1 Feb. 1, 2018

Related U.S. Application Data

(63) Continuation of application No. 14/644,148, filed on Mar. 10, 2015, now Pat. No. 9,799,385.

(60) Provisional application No. 62/047,515, filed on Sep. 8, 2014.

(51) Int. Cl.
*G11C 11/16* (2006.01)
*G11C 13/00* (2006.01)
*G11C 7/04* (2006.01)

(52) U.S. Cl.
CPC .......... *G11C 11/1673* (2013.01); *G11C 7/04* (2013.01); *G11C 13/004* (2013.01); *G11C 2013/0042* (2013.01); *G11C 2013/0054* (2013.01)

(58) Field of Classification Search
CPC ..... G11C 11/1673; G11C 7/04; G11C 13/004; G11C 2013/0042; G11C 2013/0054
See application file for complete search history.

(56) References Cited

U.S. PATENT DOCUMENTS

| | | | |
|---|---|---|---|
| 2002/0080644 A1 | 6/2002 | Ito et al. | |
| 2004/0179414 A1 | 9/2004 | Hsu | |
| 2005/0030814 A1* | 2/2005 | Oh | G11C 7/06 365/222 |
| 2005/0047240 A1 | 3/2005 | Ikehashi et al. | |
| 2005/0254294 A1 | 11/2005 | Iwata | |
| 2006/0050584 A1* | 3/2006 | Gogl | G11C 7/02 365/207 |
| 2007/0058425 A1* | 3/2007 | Cho | G11C 13/0004 365/163 |
| 2008/0291969 A1 | 11/2008 | Chu et al. | |

(Continued)

*Primary Examiner* — Khamdan N. Alrobaie
(74) *Attorney, Agent, or Firm* — Holtz, Holtz & Volek PC

(57) ABSTRACT

A resistance change memory including a memory cell having a resistance change element; a reference voltage generating circuit which generates a reference adjustment voltage; a first transistor which has a source and a drain, the drain providing a reference current in accordance with the reference adjustment voltage; and a sense amplifier which compares a cell current flowing through the memory cell with the reference current flowing through the first transistor. The reference voltage generating circuit includes a second transistor having a gate coupled to a gate of the first transistor, the reference adjustment voltage changing in accordance with a temperature, and the first transistor is an n-channel MOS transistor, and operates in a linear region which changes in a current value in accordance with the reference adjustment voltage.

20 Claims, 11 Drawing Sheets

(56) References Cited

U.S. PATENT DOCUMENTS

| | | |
|---|---|---|
| 2009/0086534 A1 | 4/2009 | Debrosse et al. |
| 2009/0175108 A1 | 7/2009 | Dittrich et al. |
| 2009/0265678 A1 | 10/2009 | Jung et al. |
| 2009/0268509 A1 | 10/2009 | Maejima |
| 2010/0157672 A1 | 6/2010 | Barkley et al. |
| 2013/0002217 A1 | 1/2013 | Kim et al. |
| 2015/0070969 A1* | 3/2015 | Hatsuda ............... G11C 13/004 365/148 |
| 2016/0071567 A1 | 3/2016 | Fujita |
| 2018/0114562 A1* | 4/2018 | Lee ........................ G11C 7/14 |

* cited by examiner

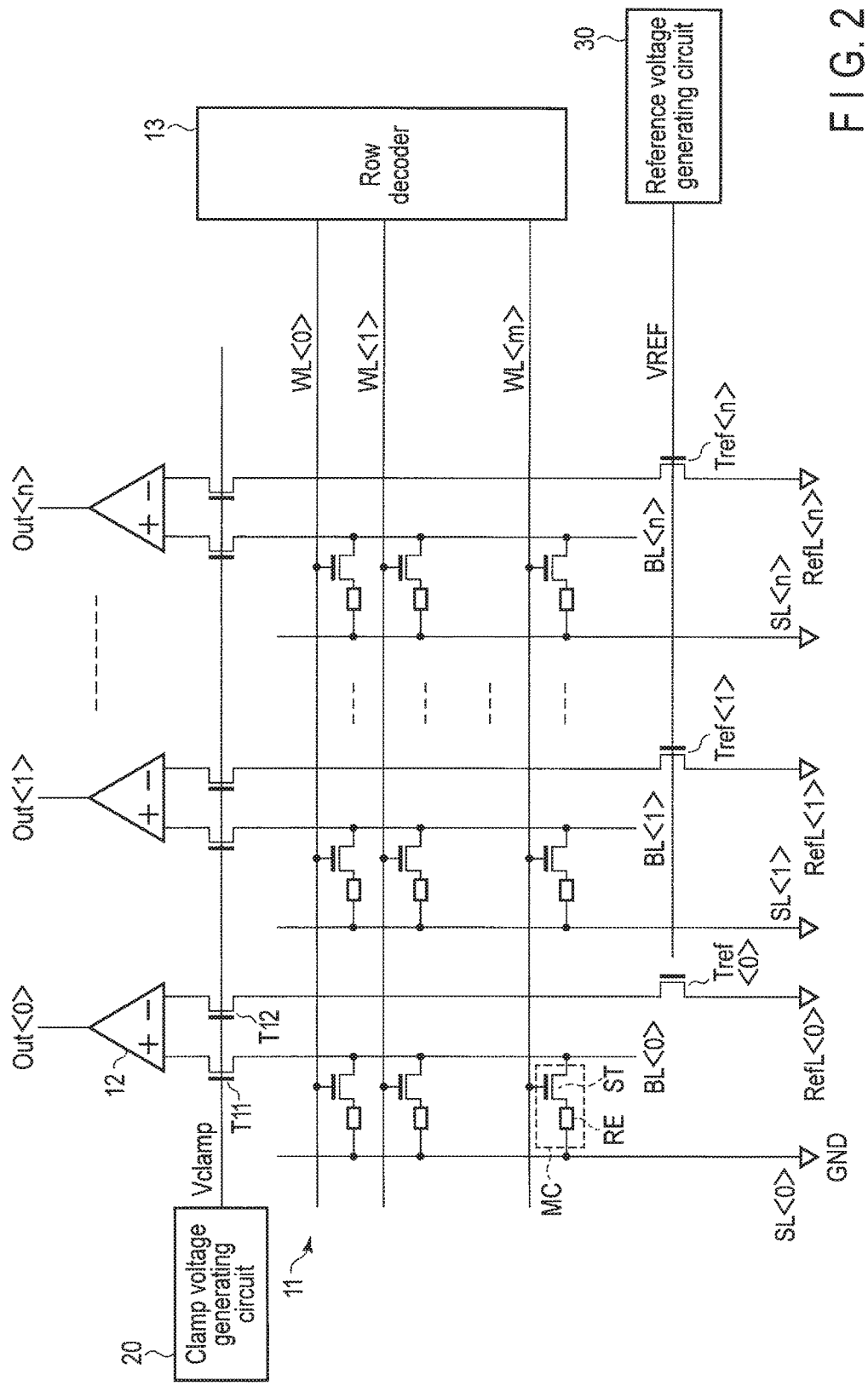
F I G. 2

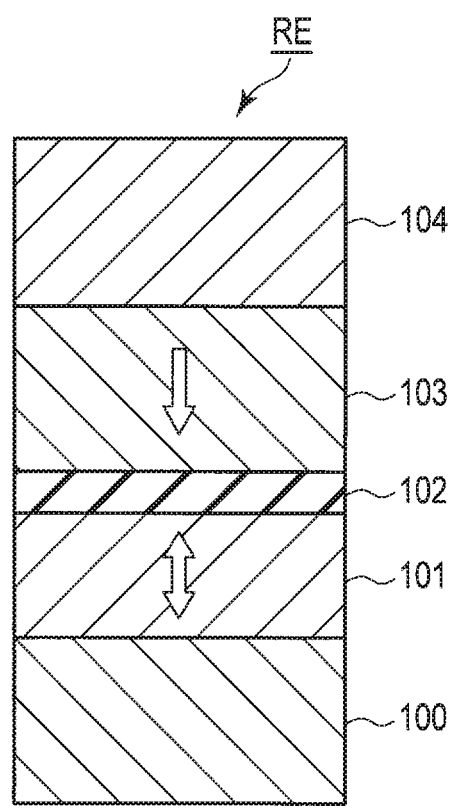
F I G. 3

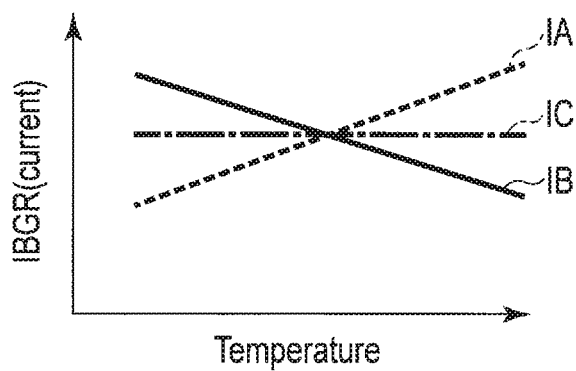
F I G. 5
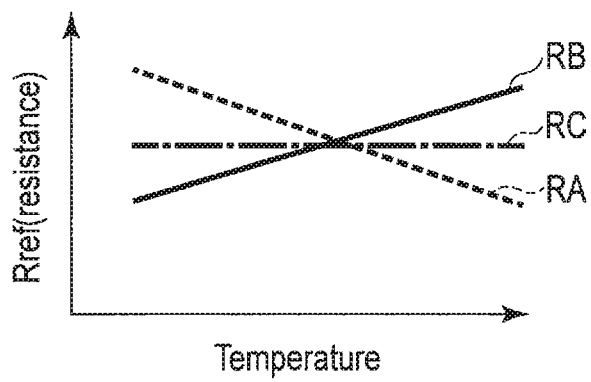
F I G. 6

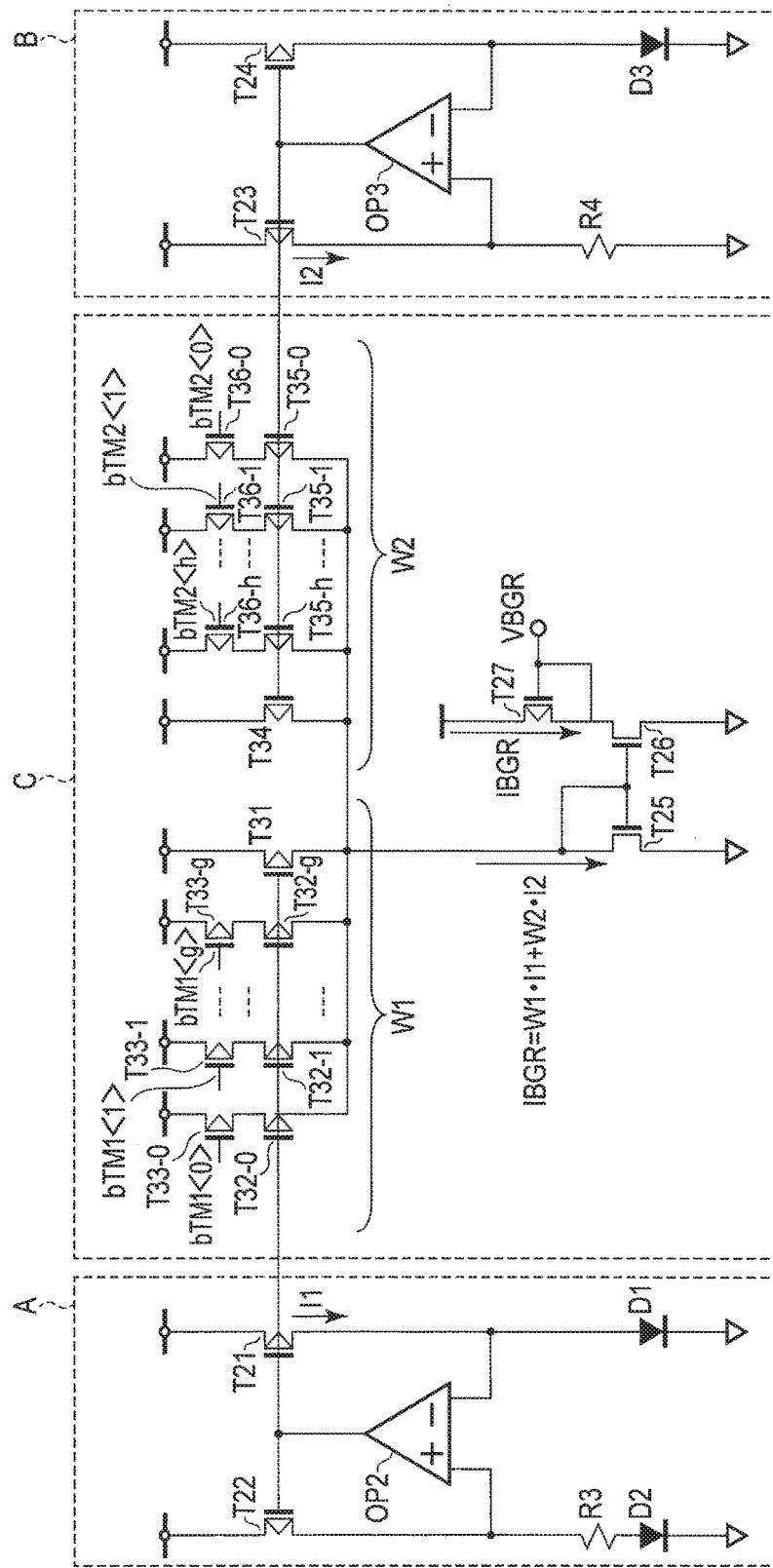
F I G. 7

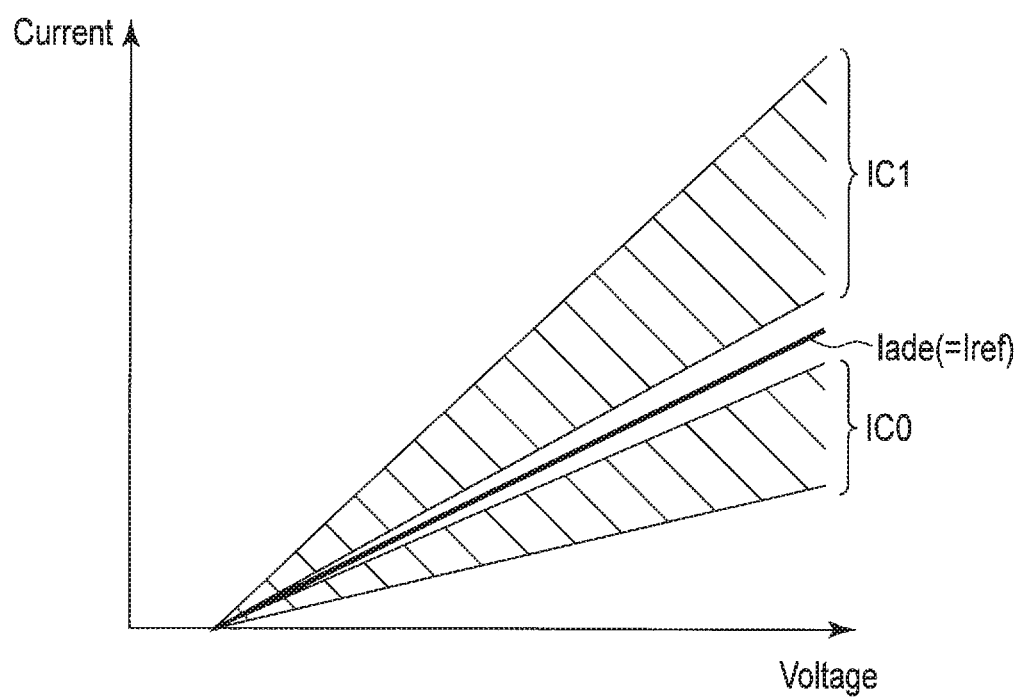
F I G. 11

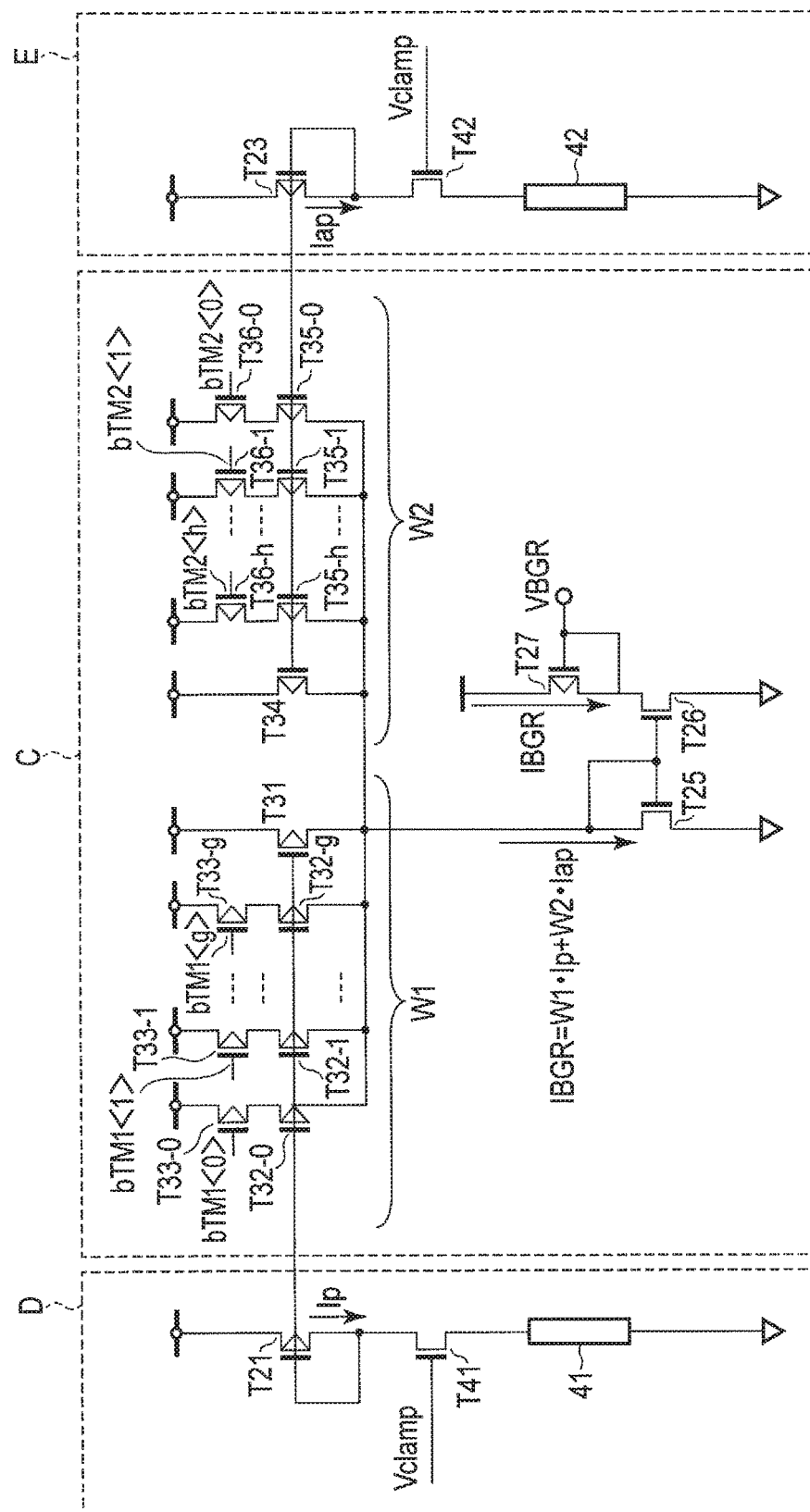
F I G. 15

RESISTANCE CHANGE MEMORY

CROSS-REFERENCE TO RELATED APPLICATIONS

This application is a Continuation application of U.S. Ser. No. 14/644,148, filed Mar. 10, 2015, which claims the benefit of U.S. Provisional Application No. 62/047,515, filed Sep. 8, 2014, the entire contents of all of which are incorporated herein by reference.

FIELD

Embodiments described herein relate generally to a resistance change memory that stores data by using the change of the resistance value of a memory element.

BACKGROUND

Recently, attention has been focused on semiconductor memories that use, as a memory device, a nonvolatile memory such as a resistance change memory (e.g., a magnetoresistive random access memory: MRAM, a phase change random access memory: PRAM, or a resistive random access memory: ReRAM).

In the resistance change memory, the change of its resistance value caused by the application of a current (or voltage) is used to determine whether data is "1" or "0".

BRIEF DESCRIPTION OF THE DRAWING

FIG. 2 is a circuit diagram showing the configuration of a memory block according to the embodiment;

FIG. 3 is a sectional view of an MTJ element according to the embodiment;

FIG. 5 is a graph showing the temperature characteristics of a current IBGR according to the first embodiment;

FIG. 6 is a graph showing the temperature characteristics of a reference resistance Rref according to the first embodiment;

FIG. 7 is a circuit diagram of a potential generating circuit in a reference voltage generating circuit 30 according to the first embodiment;

FIG. 11 is a graph showing the relation between the clamp voltage and a reference current as well as a cell current;

FIG. 15 is a circuit diagram of a potential generating circuit according to a modification.

DETAILED DESCRIPTION

Hereinafter, a resistance change memory according to an embodiment will be described with reference to the drawings. In the following description, like reference signs are provided to components having the same functions and configurations, and repeated explanations are given only when necessary. Embodiments shown below illustrate devices and methods which embody the technical concepts of the embodiments, and the technical ideas of the embodiments do not specify the quality of the material, form, structure, arrangement of components, etc., to the following.

In general, according to one embodiment, a resistance change memory includes a memory cell, a reference voltage generating circuit, a first transistor and a sense amplifier. The memory cell includes a resistance change element. The reference voltage generating circuit generates a reference adjustment voltage. The first transistor provides a reference current in accordance with the reference adjustment voltage. The sense amplifier compares a cell current flowing through the memory cell with the reference current flowing through the first transistor.

In the embodiments below, an MRAM is described as an example of the resistance change memory.

First Embodiment

First, an MRAM according to the first embodiment is described. In the first embodiment, a three-terminal device such as an n-channel MOS transistor (hereinafter, a reference transistor) is used for a reference current Iref to provide a reference resistance. Moreover, a reference voltage having temperature characteristics (or temperature dependence) is supplied to the gate of the reference transistor to allow the reference transistor to serve as a reference resistance having temperature characteristics.

1. Configuration of MRAM

Figure 1:
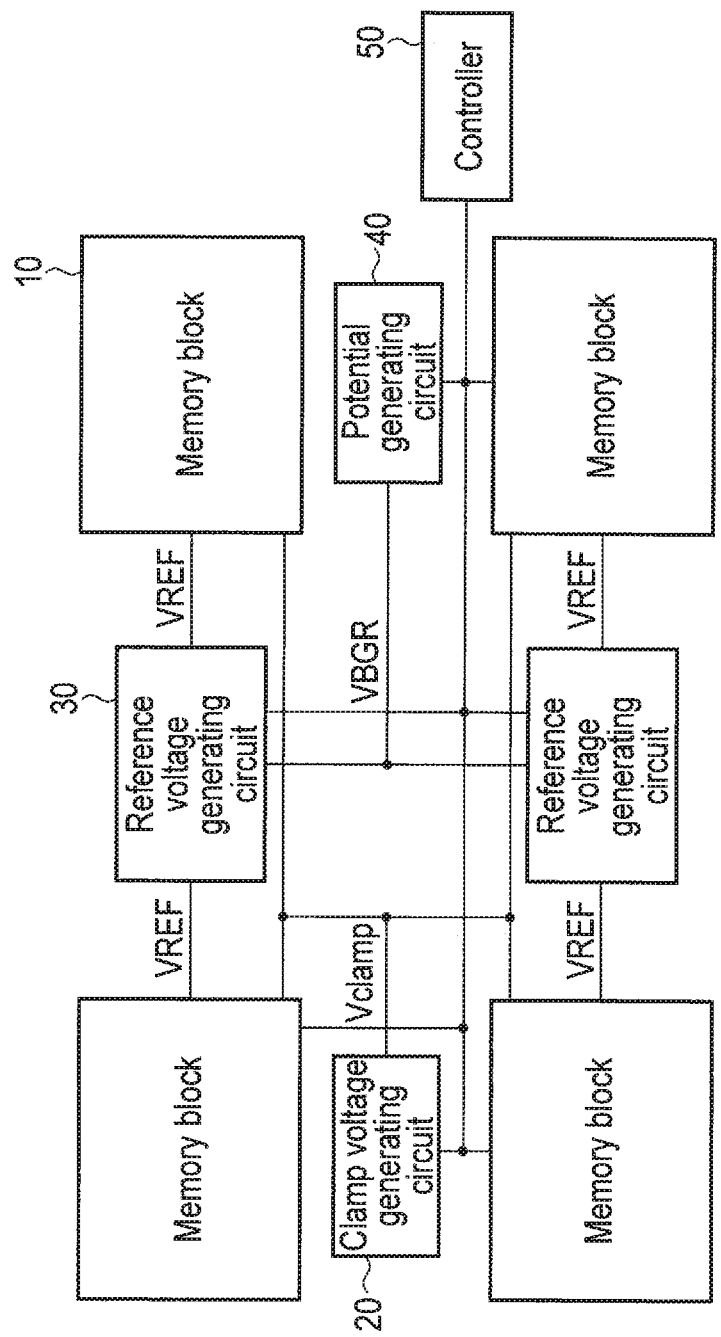
FIG. 1 is a block diagram showing the schematic configuration of an MRAM according to an embodiment.

FIG. 1 is a block diagram showing the schematic configuration of the MRAM according to the first embodiment.

The MRAM according to the present embodiment comprises a memory block 10, a clamp voltage generating circuit 20, a reference voltage generating circuit 30, a potential generating circuit 40, and a controller 50.

The memory block 10 has, for example, a memory cell array, a sense amplifier (S/A), and a row decoder. The memory cell array includes memory cells. The clamp voltage generating circuit 20 generates a clamp voltage Vclamp to restrict a cell current flowing through the memory cells. The reference voltage generating circuit 30 generates a reference voltage VREF to control a reference current. The potential generating circuit 40 generates a voltage VBGR.

The controller 50 performs overall control of the operations of the memory block 10, the clamp voltage generating circuit 20, the reference voltage generating circuit 30, and the potential generating circuit 40. The controller 50 receives an address (including a row address and a column address), and control signals such as a clock signal and a command. The controller 50 supplies various control signals and various voltages to the memory block 10, the clamp voltage generating circuit 20, the reference voltage generating circuit 30, and the potential generating circuit 40 to control the operations of these circuits.

1.1 Configuration of Memory Block

FIG. 2 is a circuit diagram showing the configuration of the memory block according to the first embodiment.

The memory block 10 comprises a memory cell array 11, a sense amplifier 12, and a row decoder 13.

In the memory cell array 11, there are arranged memory cells MC, bit lines BL<0>, BL<1>, ..., and BL<n>, source lines SL<0>, SL<1>, ..., and SL<n>, word lines WL<0>, WL<1>, ..., and WL<m>, and reference bit lines RefL<0>, RefL<1>, ..., and RefL<n>. n and m are natural numbers equal to or more than 0.

The memory cells MC are arrayed in a matrix form. The memory cell MC is coupled between the bit line BL and the source line SL. The memory cell MC comprises a magnetoresistive effect element such as a magnetic tunnel junction (MTJ) element RE to serve as a resistance change element, and a select transistor ST. The select transistor ST comprises, for example, an n-channel MOS field effect transistor (hereinafter, an nMOS transistor). The structure of the MTJ element RE will be described in detail later.

The word line WL is disposed to intersect (e.g., intersect at right angles) with the bit line BL and the source line SL. One end of the word line WL is coupled to the row decoder 13. One row of the memory cell array, that is, one page of memory cells is coupled to one word line WL, and one column of the memory cell array is coupled to a pair including one bit line BL and one source line SL.

The drain of the select transistor ST is coupled to the bit line BL, and the source of the select transistor ST is coupled to one end of the MTJ element RE. The other end of the MTJ element RE is coupled to the source line SL. The gate of the select transistor ST is coupled to the word line WL.

The bit line BL is coupled to a first input terminal (+) of the sense amplifier 12 via a clamp transistor T11. The source line SL is coupled to a reference voltage such as a ground voltage GND. One end of the reference bit line RefL is coupled to a second input terminal (−) of the sense amplifier 12 via an nMOS transistor T12. The other end of the reference bit line RefL is coupled to the reference voltage via a reference transistor Tref. That is, the second input terminal of the sense amplifier 12 is coupled to the reference voltage via the nMOS transistor T12 and the reference transistor Tref that are coupled in series. The clamp transistor T11 and the reference transistor Tref each comprises, for example, an nMOS transistor.

The clamp voltage generating circuit 20 supplies the clamp voltage Vclamp to the gates of the clamp transistor T11 and the nMOS transistor T12. Because of this clamp voltage Vclamp, the clamp transistor T11 restricts the cell current to prevent read disturb in the memory cell MC.

The reference voltage generating circuit 30 supplies the reference voltage VREF to the gate of the reference transistor Tref. As a result of the control of the reference voltage VREF by the reference voltage generating circuit 30, the reference transistor Tref changes in resistance value in response to the temperature of the place where the memory cell MC is placed, that is, the temperature of the memory cell. That is, the reference transistor Tref acts as a reference resistance Rref having temperature characteristics corresponding to the temperature characteristics of the memory cell MC. In other words, the reference transistor Tref acts as the reference resistance Rref having a temperature dependence equivalent to the temperature dependence of the resistance value of the memory cells MC due to the control of the reference voltage VREF.

The row decoder 13 selects one of the word lines WL<0> to WL<m> in accordance with the row address.

The sense amplifier 12 reads data stored in the memory cells MC. The sense amplifier 12 of, for example, a current detection type, compares a cell current ICELL flowing through the memory cell MC via the bit line BL with the reference current Iref flowing through the reference transistor Tref via the reference bit line RefL, and thereby reads the data stored in the selected memory cell, that is, detects and amplifies the data stored in the selected memory cell. The sense amplifier 12 outputs the data read from the selected memory cell as output signals Out<0>, Out<1>, ..., and Out<n> from output terminals, respectively.

1.2 Structure of MTJ Element

Now, one example of the structure of the MTJ element RE included in the memory cell MC is described. FIG. 3 is a sectional view of the MTJ element RE. The MTJ element RE comprises a lower electrode 100, a storage layer (also referred to as a free layer) 101, a nonmagnetic layer (tunnel barrier layer) 102, a reference layer (also referred to as a fixed layer) 103, and an upper electrode 104 that are stacked in order. The storage layer 101 and the reference layer 103 may be stacked in reverse order.

The storage layer 101 and the reference layer 103 are each made of a ferromagnetic material. An insulating material such as MgO is used as the tunnel barrier layer 102.

The storage layer 101 and the reference layer 103 each have perpendicular magnetic anisotropy, and their easy magnetization directions are perpendicular directions. The magnetization directions of the storage layer 101 and the reference layer 103 may be in-plane directions.

The magnetization direction of the storage layer 101 is variable (inverted). The magnetization direction of the reference layer 103 is invariable (fixed). The reference layer 103 is set to have sufficiently higher perpendicular magnetic anisotropic energy than the storage layer 101. The magnetic anisotropy can be set by adjusting the material constitution and thickness. Thus, a magnetization inversion current for the storage layer 101 is lower, and a magnetization inversion current for the reference layer 103 is higher than that for the storage layer 101. As a result, it is possible to obtain the MTJ element RE that comprises the storage layer 101 variable in magnetization direction and the reference layer 103 invariable in magnetization direction for a predetermined write current.

According to the present embodiment, a spin-transfer torque writing method is used so that a write current is directly passed through the MTJ element RE, and the magnetization state of the MTJ element RE is controlled by this write current. The MTJ element RE can take one of a low-resistance state and a high-resistance state depending on whether the magnetizations of the storage layer 101 and the reference layer 103 are parallel or antiparallel.

If a write current flowing from the storage layer 101 to the reference layer 103 is passed through the MTJ element RE, the magnetizations of the storage layer 101 and the reference layer 103 are parallel. In this parallel state, the resistance value of the MTJ element RE is lowest, and the MTJ element RE is set to the low-resistance state. The low-resistance state of the MTJ element RE is defined as, for example, data "0".

On the other hand, if a write current flowing from the reference layer 103 to the storage layer 101 is passed through the MTJ element RE, the magnetizations of the storage layer 101 and the reference layer 103 are antiparallel. In this antiparallel state, the resistance value of the MTJ element RE is highest, and the MTJ element RE is set to the high-resistance state. The high-resistance state of the MTJ element RE is defined as, for example, data "1".

Consequently, the MTJ element RE can be used as a storage element capable of storing one-bit data (binary data). Any resistance state of the MTJ element RE and any allocation of data can be set.

When data is read from the MTJ element RE, a read voltage is applied to the MTJ element RE, and the resistance value of the MTJ element RE is detected in accordance with a read current flowing through the MTJ element RE at the moment. This read voltage is set to a value sufficiently lower than a threshold at which the magnetization is reversed by spin-transfer torque.

1.3 Configuration of Reference Voltage Generating Circuit

Figure 4:
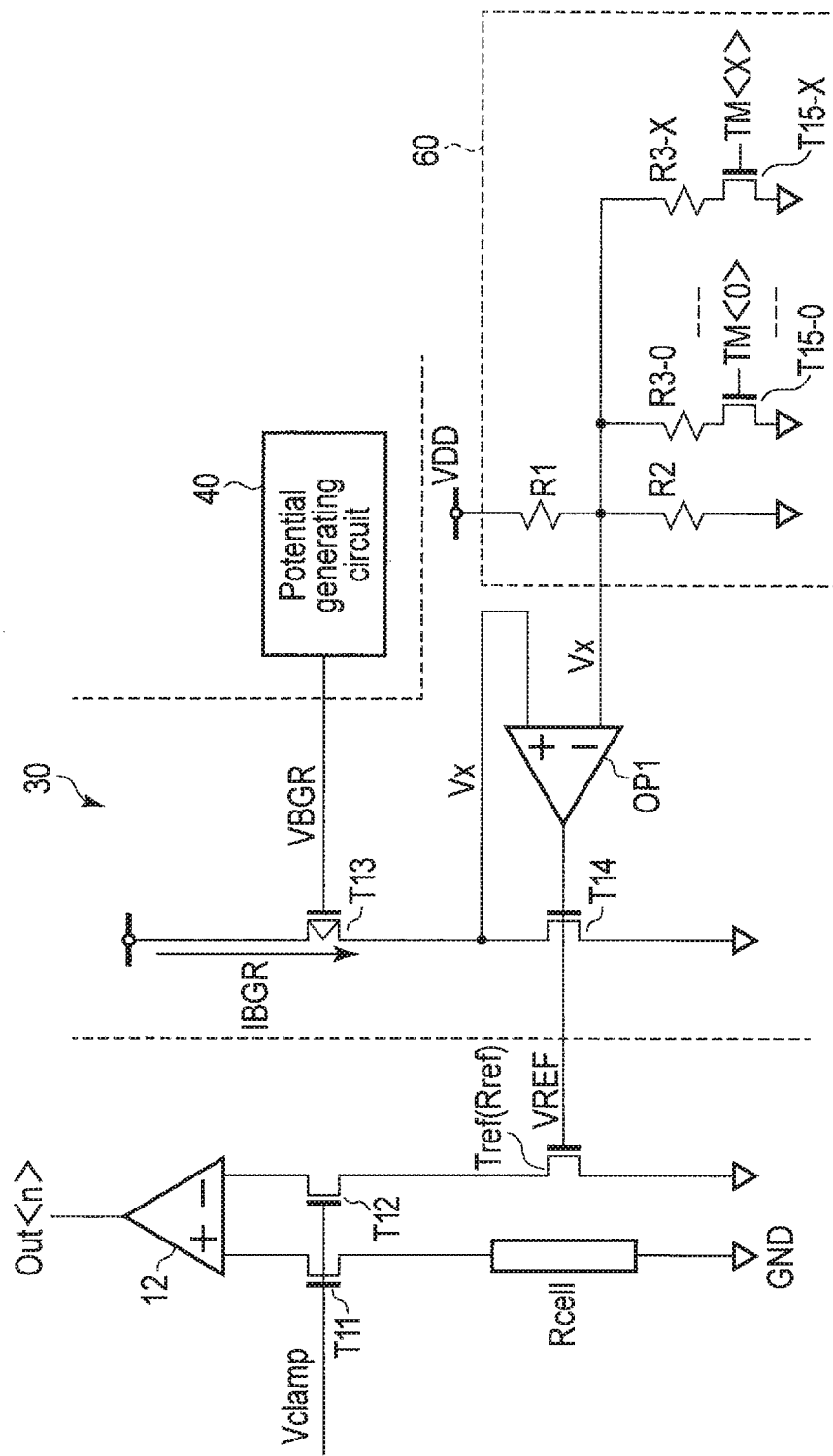
FIG. 4 is a circuit diagram showing the configurations of a sense amplifier and a reference voltage generating circuit according to a first embodiment.

FIG. 4 is a circuit diagram showing the configurations of the sense amplifier 12 and the reference voltage generating circuit 30 according to the first embodiment.

As shown, one end of a cell resistance Rcell is coupled to the first input terminal (+) of the sense amplifier 12 via the clamp transistor T11. The other end of the cell resistance Rcell is coupled to the reference voltage. The cell resistance Rcell indicates the resistance of the memory cell MC. In the configuration schematically shown here, the first input terminal of the sense amplifier 12 is coupled to the reference voltage via the bit line BL, the memory cell MC, and the source line SL.

One end of the current path of the reference transistor Tref is coupled to the second input terminal (−) of the sense amplifier 12 via the nMOS transistor T12. The other end of the current path of the reference transistor Tref is coupled to the reference voltage. The clamp voltage Vclamp is supplied to the gates of the clamp transistor T11 and the nMOS transistor T12.

The reference voltage generating circuit 30 has the following configuration. The reference voltage generating circuit 30 has a p-channel MOS field effect transistor (hereinafter, a pMOS transistor) T13, a replica transistor T14, an operational amplifier OP1, and a resistance dividing circuit 60. The replica transistor T14 comprises an n-channel MOS transistor.

The source of the pMOS transistor T13 is coupled to a power supply voltage VDD, and the drain of the pMOS transistor T13 is coupled to the drain of the replica transistor T14. The source of the replica transistor T14 is coupled to the reference voltage. Further, the voltage VBGR is supplied to the gate of the pMOS transistor T13 from the potential generating circuit 40.

A noninverting input terminal (+) of the operational amplifier OP1 is coupled to the drain of the replica transistor T14. An inverting input terminal (−) of the operational amplifier OP1 is coupled to the resistance dividing circuit 60. That is, the inverting input terminal of the operational amplifier OP1 is coupled between a resistance R2, resistances R3-0, ..., and R3-X that are coupled in parallel, and a resistance R1. The inverting input terminal is coupled to one end of each of the resistance R2, the resistances R3-0, ..., and R3-X, and the resistance R1. The other end of the resistance R1 is coupled to the power supply voltage VDD. The other end of the resistance R2 is coupled to the reference voltage, and the other ends of the resistances R3-0, ..., and R3-X are coupled to the reference voltages via nMOS transistors T15-0, ..., and T15-X, respectively. Further, test mode signals TM<0>, ..., and TM<X> are input to the gates of the nMOS transistors T15-0, ..., and T15-X. X is a natural number equal to or more than 0.

An output terminal of the operational amplifier OP1 is coupled to the gate of the replica transistor T14 and the gate of the reference transistor Tref.

The operation of the circuit shown in FIG. 4 is described below.

First, the common clamp voltage Vclamp is supplied to the gate of the clamp transistor T11 and the gate of the nMOS transistor T12. The reference transistor Tref corresponds to the reference resistance Rref for generating the reference current Iref. The reference transistor Tref operates in a triode region (linear region) by the control of a gate potential. Moreover, means for controlling the gate potential of the reference transistor Tref, that is, the reference voltage generating circuit 30 is provided.

The reference voltage generating circuit 30 comprises a negative feedback circuit including the replica transistor T14 of the reference transistor Tref and the operational amplifier OP1 which forms the drain potential of the replica transistor T14 into a predetermined voltage Vx, and the pMOS transistor T13 which supplies a current IBGR. The current IBGR is generated by a current mirror in the potential generating circuit 40, and is set to have desired temperature characteristics.

When the current IBGR is passed through the drain of the replica transistor T14, a potential generated in the gate of the replica transistor T14 serves as the desired reference voltage VREF. At the same time, the resistance value of the replica transistor T14 is Vx/IBGR. Therefore, if the voltage Vx is varied by the test mode signals TM<0>, ..., and TM<X> and if the temperature characteristics of the current IBGR are set to desired characteristics by the potential generating circuit 40, it is possible to generate the reference voltage VREF which sets the resistance value of the replica transistor T14 to a desired resistance value that follows the temperature characteristics and process conditions of the cell resistance Rcell.

Here, the clamp voltage Vclamp is adjusted to set the drain potential of the reference transistor Tref to the voltage Vx. If the reference voltage VREF is input to the gate of the reference transistor Tref, the resistance value (reference resistance Rref) of the reference transistor Tref will be Vx/Iref.

Now, the temperature characteristics of the current IBGR and the reference resistance Rref according to the first embodiment are described with reference to FIGS. 5 and 6. FIGS. 5 and 6 are graphs showing the temperature characteristics of the current IBGR and the temperature characteristics of the reference resistance Rref, respectively.

The reference resistance Rref and the current IBGR have the relation "Rref=Vx/IBGR". Thus, when the current IBGR has positive temperature characteristics, that is, when the current IBGR has such characteristics as to increase as the temperature rises (IA in FIG. 5), the reference resistance Rref has negative temperature characteristics, that is, the reference resistance Rref has such characteristics as to decrease as the temperature rises (RA in FIG. 6).

When the current IBGR has negative temperature characteristics, that is, when the current IBGR has such characteristics as to decrease as the temperature rises (IB in FIG. 5), the reference resistance Rref has positive temperature characteristics, that is, the reference resistance Rref has such characteristics as to increase as the temperature rises (RB in FIG. 6).

When the current IBGR has no temperature characteristics, that is, when the current IBGR does not change in spite of a temperature change (IC in FIG. 5), the reference resistance Rref does not have temperature characteristics either, that is, the reference resistance Rref does not change in spite of the temperature change (RC in FIG. 6).

Now, the potential generating circuit 40 for supplying the current IBGR in the reference voltage generating circuit 30 according to the first embodiment is described with reference to FIG. 7. FIG. 7 shows one example of a circuit configuration for supplying the current IBGR in the reference voltage generating circuit 30.

The circuit for supplying the current IBGR includes a current generating unit A, a current generating unit B, and a current mirror unit C.

The current generating unit A has diodes D1 and D2, a resistance R3, an operational amplifier OP2, and pMOS transistors T21 and T22, and generates a current I1 having positive temperature characteristics. The positive temperature characteristics are such characteristics that the current I1 increases as a temperature rises.

The current generating unit B has a diode D3, a resistance R4, an operational amplifier OP3, and pMOS transistors T23 and T24, and generates a current I2 having negative temperature characteristics. The negative temperature characteristics are such characteristics that the current I2 decreases as the temperature rises.

The current mirror unit C includes nMOS transistors T25 and T26, a pMOS transistor T27, and circuit units W1 and W2.

The circuit unit W1 includes a pMOS transistor T31 coupled between the drain of the nMOS transistor T25 and the power supply voltage VDD. The circuit unit W1 further includes pMOS transistors T32-0 and T33-0, pMOS transistors T32-1, T33-1, and . . . , and pMOS transistors T32-$g$ and T33-$g$ that are coupled in series between the drain of the nMOS transistor T25 and the power supply voltage VDD. A voltage output from the output terminal of the operational amplifier OP2 is supplied to the gates of the pMOS transistors T32-0, T32-1, . . . , and T32-$g$. Test mode signals bTM1<0>, bTM1<1>, . . . , and bTM1<$g$> are supplied to the gates of the pMOS transistors T33-0, T33-1, . . . , and T33-$g$, respectively. $g$ is a natural number equal to or more than 0.

The circuit unit W2 includes a pMOS transistor T34 coupled between the drain of the nMOS transistor T25 and the power supply voltage VDD. The circuit unit W2 further includes pMOS transistors T35-0 and T36-0, pMOS transistors T35-1 and T36-1, . . . , and pMOS transistors T35-$h$ and T36-$h$ that are coupled in series between the drain of the nMOS transistor T25 and the power supply voltage VDD. A voltage output from the output terminal of the operational amplifier OP3 is supplied to the gates of the pMOS transistors T35-0, T35-1, . . . , and T35-$h$. Test mode signals bTM2<0>, bTM2<1>, . . . , and bTM2<$h$> are supplied to the gates of the pMOS transistors T36-0, T36-1, . . . , and T36-$h$, respectively. $h$ is a natural number equal to or more than 0.

The current mirror unit C takes a current sum by weighting, in the circuit units W1 and W2, the currents I1 and I2 respectively generated in the current generating unit A and the current generating unit B, and generates the current IBGR (=W1·I1+W2·I2). In this expression, W1 and W2 represent coefficients weighted by the circuit units W1 and W2. The coefficients W1 and W2 can be changed if the current mirror ratio is changed by the test mode signals bTM1 and bTM2.

Figure 8:
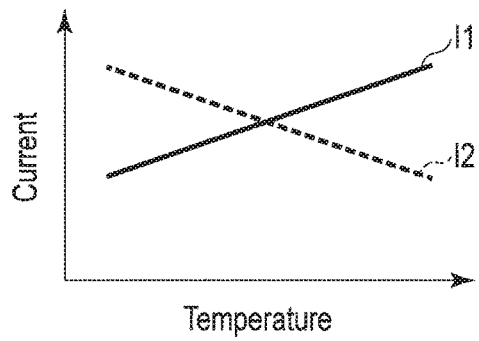
FIG. 8 is a graph showing the temperature characteristics of currents I1 and I2 in the potential generating circuit.
Figure 9:
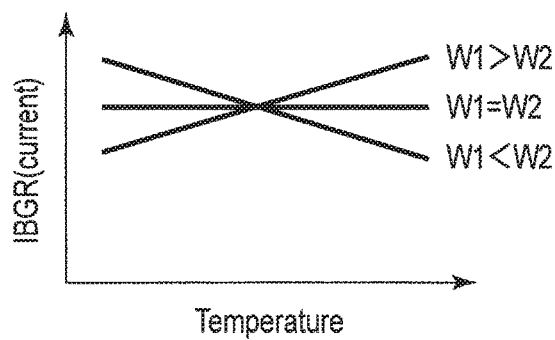
FIG. 9 is a graph showing the temperature characteristics of the current IBGR in the potential generating circuit.

The operation of the circuit shown in FIG. 7 is described below. FIG. 8 is a graph showing the temperature characteristics of the currents I1 and I2 in the potential generating circuit. FIG. 9 is a graph showing the temperature characteristics of the current IBGR in the potential generating circuit.

The current generating unit A generates the current I1 having the positive temperature characteristics. That is, the current generating unit A increases the current I1 as a temperature rises as shown in FIG. 8. The current generating unit B generates the current I2 having the negative temperature characteristics. That is, the current generating unit B decreases the current I2 as the temperature rises.

Here, if it is necessary for the current IBGR to have the positive temperature characteristics as shown in FIG. 9, the current mirror ratio is adjusted by the test mode signals bTM1 and bTM2 so that W1>W2. On the other hand, if it is necessary for the current IBGR to have the negative temperature characteristics, the current mirror ratio is adjusted by the test mode signals bTM1 and bTM2 so that W1<W2.

More specifically, "Low(L)" or "High(H)" is applied to the gates of the pMOS transistors T33-0 to T33-$g$ and T36-0 to T36-$h$ by the test mode signals bTM1 and bTM2, and the pMOS transistors T33-0 to T33-$g$ and T36-0 to T36-$h$ are switched on or off. The magnitudes of the coefficient W1 and the coefficient W2 are adjusted by the number of the on-state pMOS transistors T33 in the circuit unit W1 and the number of the on-state pMOS transistors T36 in the circuit unit W2 at the moment. If it is not necessary for the current IBGR to have temperature characteristics, the current mirror ratio has only to be adjusted by the test mode signals bTM1 and bTM2 so that the coefficient W1 and the coefficient W2 will be equal to each other.

Otherwise, it is also possible to vary the absolute values of I1 and I2 so that W1/W2 remains constant, and vary the absolute value of the current IBGR. If the absolute value of the current IBGR is varied, the absolute value of the reference resistance Rref can be varied in the same way as the voltage Vx is varied.

Now, a process of determining the potentials of the clamp voltage Vclamp and the reference voltage VREF is described. In the manufacturing process of the MRAM described here, a test mode is conducted to determine the potentials of the clamp voltage Vclamp and the reference voltage VREF, and a fuse corresponding to the determined test mode is blown.

Figure 10:
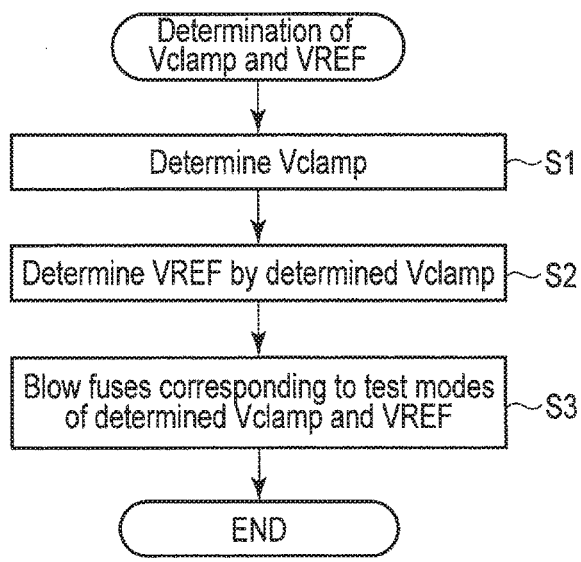
FIG. 10 is a flowchart showing a process of determining a clamp voltage and a reference voltage.

FIG. 10 is a flowchart showing the process of determining the potentials of the clamp voltage Vclamp and the reference voltage VREF.

First, a test is ran while the potential of the clamp voltage Vclamp is being changed in the test mode. From the test result, the clamp voltage Vclamp is determined to be a potential that does not cause read disturb in the memory cell MC (step S1).

The optimum reference voltage VREF is then determined by the following procedure when the clamp voltage Vclamp determined in step S1 is supplied. First, the MRAM is put in an environment at a temperature A (e.g., room temperature), and a reference voltage VREFA which is optimum at the temperature A is determined. The MRAM is then put in an environment at a temperature B (e.g., a high temperature) higher than the temperature A, and a reference voltage VREFB which is optimum at the temperature B is determined. A test mode signal TM in the reference voltage generating circuit 30 that satisfies the reference voltages VREFA and VREFB and the test mode signals bTM1 and bTM2 in the potential generating circuit 40 are then selected (step S2).

Fuses corresponding to the test mode signals for generating the clamp voltage Vclamp and the reference voltage VREF determined in steps S1 and S2 are blown (step S3).

Consequently, the potential of the voltage Vx, and the absolute value and temperature characteristics of the current IBGR are determined, and the reference resistance Rref is determined from the voltage Vx and the current IBGR. Here, in the manufacturing method, the reference voltage VREF is determined by blowing the fuse corresponding to the test mode signal. However, this is not a limitation. The controller 50 may supply the test mode signal at the time of power supply starting to determine the reference voltage VREF.

2. Advantageous Effects

In the memory cell array, generally, the resistance of the "0" cell and the resistance of the "1" cell vary from each other even in the same chip, and a cell current IC0 flowing through the "0" cell and a cell current IC1 flowing through the "1" cell have distributions shown in FIG. 11. Thus, an optimum reference current Iade that ensures the maximum sense margin in the sense amplifier is located in the center of the area between the distribution of the cell current IC0 and the distribution of the cell current IC1.

However, the cell resistance also varies according to chips, and therefore, the average value of the cell current IC0 and the cell current IC1 also varies according to chips. As a result, the reference current Iade that should be located in the center of the area between the distribution of the cell current IC0 and the distribution of the cell current IC1 also varies according to chips. Therefore, the reference resistance Rref needs to be adjusted so that the reference current IREF corresponds to the optimum reference current Iade for each chip. Moreover, in many cases, the cell resistance and the reference resistance are made of different kinds of materials, thus the problem is that it is difficult to satisfy the above-mentioned requirements under all conditions: process variations, voltage, and temperature.

Thus, according to the present embodiment, a three-terminal device such as an n-channel MOS transistor (reference transistor) is used as the reference resistance so that the reference voltage to be supplied to the gate of the reference transistor has temperature characteristics. The reference transistor is set to operate in a linear region in accordance with the reference voltage supplied to the gate. The reference voltage generating circuit generates a reference voltage having positive or negative temperature characteristics depending on the temperature characteristics of the memory cell (MTJ element). The reference voltage generating circuit can also generate a reference voltage having no temperature characteristics.

It is possible to form a reference transistor which has an optimum resistance value in accordance with the temperature change by supplying the reference voltage having temperature characteristics to the gate of the reference transistor. The optimum resistance value is a resistance value at which a reference current that maximizes the sense margin at the temperature of the moment can be set.

According to the present embodiment, the MOS transistor which operates in the linear region (triode region) is used for the reference resistance unit for generating the reference current, and the gate voltage of this MOS transistor is controlled to be a desired potential, so that it is possible to obtain a sense amplifier which is robust against, for example, power supply bounce noise and which can ensure a sufficient sense margin even under conditions including temperature variations and process variations.

Second Embodiment

Now, an MRAM according to the second embodiment is described. In the second embodiment, the voltage Vx has temperature characteristics, and the current IBGR is a constant current having no temperature characteristics, so that the reference voltage generating circuit generates the reference voltage VREF having temperature characteristics.

1. Configuration of MRAM

The MRAM, the memory block, and the MTJ element according to the second embodiment are similar in configuration to those according to the first embodiment, and are therefore not described.

1.1 Configuration of Reference Voltage Generating Circuit

Figure 12:
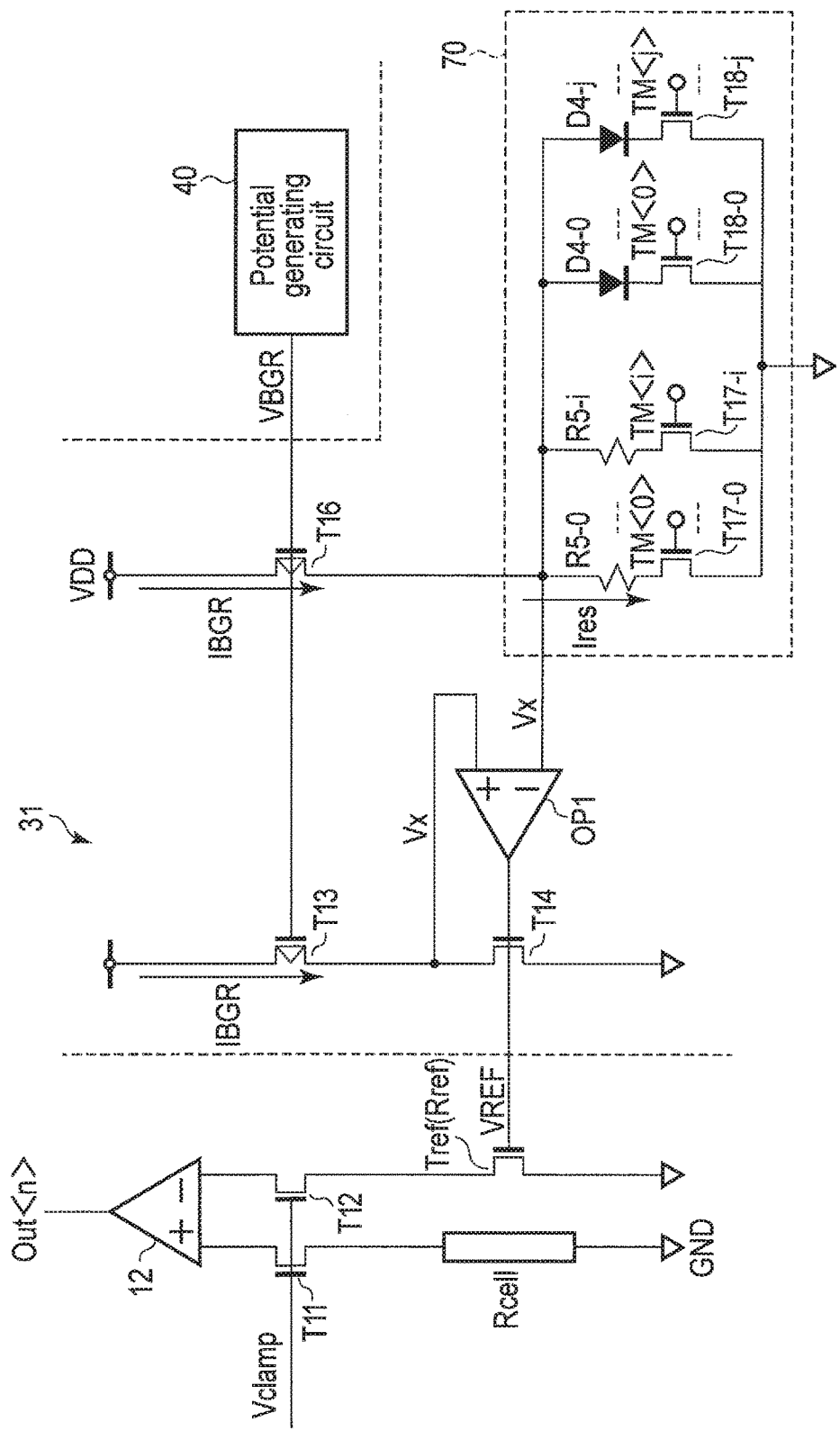
FIG. 12 is a circuit diagram showing the configurations of a sense amplifier and a reference voltage generating circuit according to a second embodiment.

FIG. 12 is a circuit diagram showing the configurations of a sense amplifier 12 and a reference voltage generating circuit 31 according to the second embodiment.

As shown, one end of a cell resistance Rcell is coupled to a first input terminal (+) of the sense amplifier 12 via a clamp transistor T11. The other end of the cell resistance Rcell is coupled to a reference voltage. The cell resistance Rcell indicates the resistance of a memory cell MC.

One end of the current path of a reference transistor Tref is coupled to a second input terminal (−) of the sense amplifier 12 via the nMOS transistor T12. The other end of the current path of the reference transistor Tref is coupled to the reference voltage. The clamp voltage Vclamp is supplied to the gates of the clamp transistor T11 and the nMOS transistor T12.

The reference voltage generating circuit 31 has the following configuration. The reference voltage generating circuit 31 has a pMOS transistor T13, a replica transistor T14, a pMOS transistor T16, an operational amplifier OP1, and a Vx generating circuit 70.

The source of the pMOS transistor T13 is coupled to a power supply voltage VDD, and the drain of the pMOS transistor T13 is coupled to the drain of the replica transistor T14. The source of the replica transistor T14 is coupled to the reference voltage. The source of the pMOS transistor T16 is coupled to the power supply voltage VDD, and the drain of the pMOS transistor T16 is coupled to an inverting input terminal (−) of the operational amplifier OP1.

A noninverting input terminal (+) of the operational amplifier OP1 is coupled to the drain of the replica transistor T14. An inverting input terminal of the operational amplifier OP1 is coupled to the Vx generating circuit 70. That is, a resistance R5-0 and an nMOS transistor T17-0, and . . . , a resistance R5-$i$ and an nMOS transistor T17-$i$, a diode D4-0 and an nMOS transistor T18-0, and . . . , and a diode R4-$j$ and an nMOS transistor T18-$j$ that are coupled in series are coupled in parallel between the inverting input terminal of the operational amplifier OP1 and the reference voltage. Test mode signals TM<0>, . . . , and TM<i> are input to the gates of the nMOS transistors T17-0, . . . , and T17-$i$. Further, test mode signals TM<0>, . . . , and TM<j> are input to the gates of the nMOS transistors T18-0, . . . , and T18-$j$. i and j are natural numbers equal to or more than 0.

A voltage VBGR is supplied to the gates of the pMOS transistor T13 and the pMOS transistor T16 from the potential generating circuit 40. An output terminal of the operational amplifier OP1 is coupled to the gate of the replica transistor T14 and the gate of the reference transistor Tref. The reference voltage VREF is supplied to the gate of the reference transistor Tref from the output terminal of the operational amplifier OP1.

The operation of the circuit shown in FIG. 12 is described below.

First, the common clamp voltage Vclamp is supplied to the gate of the clamp transistor T11 and the gate of the nMOS transistor T12. The reference transistor Tref corresponds to a reference resistance Rref for generating a reference current Iref. The reference transistor Tref operates in a triode region (linear region) by the control of a gate potential. Moreover, means for controlling the gate potential of the reference transistor Tref, that is, the reference voltage generating circuit 31 is provided.

The reference voltage generating circuit 31 comprises a negative feedback circuit including the replica transistor T14 of the reference transistor Tref and the operational amplifier OP1 which forms the drain potential of the replica transistor T14 into a predetermined voltage Vx, the pMOS transistor T13 and T16 which supply the current IBGR, and the Vx generating circuit 70. The current IBGR is generated by a current mirror in the potential generating circuit 40, and is a constant current having no temperature characteristics.

The Vx generating circuit 70 generates the voltage Vx having temperature characteristics. The Vx generating circuit 70 has resistances R5-0, R5-1, . . . , and R5-$i$ which increase in resistance value as a temperature rises, and diodes D4-0, D4-1, . . . , and D4-$j$ which decrease in resistance value as the temperature rises. "Low(L)" or "High(H)" is applied to the gates of the nMOS transistors T17-0, T17-1, . . . , and T17-$i$, and T18-0, T18-1, . . . , and T18-$j$ by the test mode signals TM<0>, . . . , and TM<$i$>, and TM<0>, . . . , and TM<$j$> to switch on or off the nMOS transistors T17-0, T17-1, . . . , and T17-$i$, and T18-0, T18-1, . . . , and T18-$j$. Thus, the resistances R5-0 to R5-$i$ and the diodes D4-0 to D4-$j$ that are coupled between the inverting input terminal of the operational amplifier OP1 and the reference voltage are selected.

Figure 13:
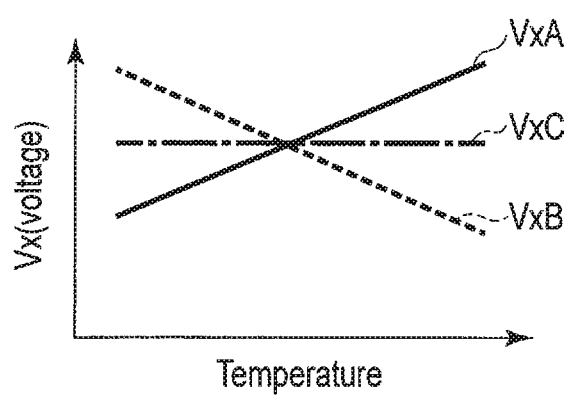
FIG. 13 is a graph showing the temperature characteristics of a voltage Vx according to the second embodiment.

Therefore, the resistances R5-0 to R5-$i$ have positive temperature characteristics, and the diodes D4-0 to D4-$j$ have negative temperature characteristics, so that as shown in FIG. 13, the voltage Vx can have positive temperature characteristics (VxA in FIG. 13), have negative temperature characteristics (VxB in FIG. 13), or have no temperature characteristics (VxC in FIG. 13).

When the current IBGR is passed through the drain of the replica transistor T14, a potential generated in the gate of the replica transistor T14 serves as the desired reference voltage VREF. At the same time, the resistance value of the replica transistor T14 is Vx/IBGR. Therefore, if the voltage Vx is varied by the test mode signals TM<0>, . . . , and TM<$i$>, and TM<0>, . . . , and TM<$j$> to provide temperature characteristics and if the current IBGR is a constant current having no temperature characteristics, it is possible to generate the reference voltage VREF which sets the resistance value of the replica transistor T14 to a desired resistance value that follows the temperature characteristics and process conditions of the cell resistance Rcell.

Here, the clamp voltage Vclamp is adjusted to set the drain potential of the reference transistor Tref to the voltage Vx. If the reference voltage VREF is input to the gate of the reference transistor Tref, the resistance value (reference resistance Rref) of the reference transistor Tref will be Vx/Iref.

Figure 14:
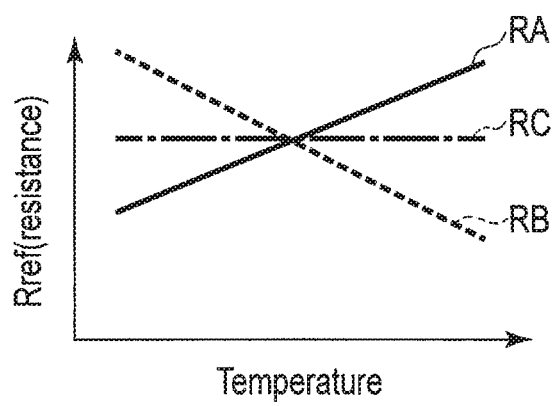
FIG. 14 is a graph showing the temperature characteristics of a reference resistance Rref according to the second embodiment.

The reference resistance Rref can be represented by "Rref=Vx/Iref", so that if the voltage Vx has positive temperature characteristics, the reference resistance Rref can have positive temperature characteristics (RA in FIG. 14) similar to those of the voltage Vx, as shown in FIG. 14. On the other hand, if the voltage Vx has negative temperature characteristics, the reference resistance Rref can have negative temperature characteristics (RB in FIG. 14) similar to those of the voltage Vx. Moreover, if the voltage Vx has no temperature characteristics, the reference resistance Rref can have no temperature characteristics (RC in FIG. 14) in a manner similar to the voltage Vx.

2. Advantageous Effects

In the second embodiment, the reference resistance Rref having temperature characteristics can be produced by the use of the current IBGR having no temperature characteristics (temperature dependence) and the voltage Vx having temperature characteristics. If the voltage Vx is adjusted so that the temperature characteristics of the memory cell are equivalent to, that is, correspond to the temperature characteristics of the reference resistance Rref, the reference current Iref flowing through the reference resistance Rref can correspond to the optimum reference current lade. The configuration and advantageous effects are similar to those according to the first embodiment in other respects.

[Modification, etc.]

A modification of the first and second embodiments is described. In the first and second embodiments, the circuit having temperature characteristics is constructed by the use of the resistive element and the diode element that are general components used in the MRAM (memory chip). However, the potential generating circuit 40 in the first embodiment (FIG. 4) or the second embodiment (FIG. 12) can be constructed by the use of the above-mentioned MTJ element RE.

An example of the use of the MTJ element RE for the current generating unit in the potential generating circuit 40 is shown in FIG. 15. In this example, the current generating units A and B shown in FIG. 4 are replaced with current generating units D and E.

The current generating unit D has an MTJ element unit 41, a pMOS transistor T21, and an nMOS transistor T41. The MTJ element unit 41 includes MTJ elements (e.g., N MTJ elements, N is a natural number equal to or more than 1). The magnetization of each of these MTJ elements is set to the parallel state. The current generating unit E has an MTJ element unit 42, a pMOS transistor T23, and an nMOS transistor T42. The MTJ element unit 42 includes MTJ elements (e.g., N MTJ elements). The magnetization of each of these MTJ elements is set to the antiparallel state.

In this modification, a current sum of a current Ip of the MTJ element unit (the N parallel MTJ elements) 41 and a current Iap of the MTJ element unit (the N antiparallel MTJ elements) 42 is taken and averaged to produce an intermediate current between a current flowing through the memory cells having the parallel MTJ elements (hereinafter, P cells) and a current flowing through the memory cells having the antiparallel MTJ elements (hereinafter, AP cells). When the intermediate current that maximizes yield is off the midpoint between the current Ip of the P cells and the current Iap of the AP cells, the P cells and the AP cells can be mounted with a ratio other than 1:1.

According to this modification, the MTJ element itself is used, so that the intermediate current between the current Ip of the P cells and the current Iap of the AP cells can be always produced even if the temperature changes. Therefore, this example is suited to another circuit example of the potential generating circuit 40.

Although the MRAM that uses the magnetoresistive effect element has been described as the resistance change memory by way of example in the above embodiment, the present invention is not limited thereto. The present invention is also applicable to various kinds of semiconductor storage devices including volatile memories and nonvolatile memories. For example, the present invention is also applicable to a resistance change memory of the same kind as the MRAM such as a resistive random access memory (ReRAM) or a phase-change random access memory (PCRAM).

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A resistance change memory comprising:
   a memory cell comprising a resistance change element;
   a reference voltage generating circuit which generates a reference adjustment voltage;
   a first transistor which has a source and a drain, the drain providing a reference current in accordance with the reference adjustment voltage; and
   a sense amplifier which compares a cell current flowing through the memory cell with the reference current flowing through the first transistor,
   wherein:
   the reference voltage generating circuit includes a second transistor having a gate coupled to a gate of the first transistor,
   the reference adjustment voltage changes in accordance with a temperature, and
   the first transistor is an n-channel MOS transistor, and operates in a linear region which changes in a current value in accordance with the reference adjustment voltage.

2. The resistance change memory according to claim 1, wherein the reference voltage generating circuit increases the reference adjustment voltage as the temperature rises.

3. The resistance change memory according to claim 1, wherein the reference voltage generating circuit decreases the reference adjustment voltage as the temperature rises.

4. The resistance change memory according to claim 1, wherein:
   the reference voltage generating circuit comprises an operational amplifier,
   a drain of the second transistor is coupled to a noninverting input terminal of the operational amplifier,
   the gate of the second transistor is coupled to an output terminal of the operational amplifier, and
   an inverting input terminal of the operational amplifier is coupled to a resistance dividing circuit which produces a predetermined voltage.

5. The resistance change memory according to claim 1, wherein the first transistor operates in a linear region which changes in a resistance value in response to a change of the reference adjustment voltage.

6. The resistance change memory according to claim 1, further comprising a first circuit which generates a first current,
   wherein the reference voltage generating circuit supplies a second current corresponding to the first current to a drain of the second transistor.

7. The resistance change memory according to claim 6, wherein the first circuit comprises a second circuit which increases the first current as the temperature rises, and a third circuit which decreases the first current as the temperature rises.

8. The resistance change memory according to claim 7, wherein the second circuit includes a diode, and the third circuit includes a resistor.

9. The resistance change memory according to claim 1, wherein:
   the reference voltage generating circuit comprises an operational amplifier,
   a drain of the second transistor is coupled to a noninverting input terminal of the operational amplifier,
   the gate of the second transistor is coupled to an output terminal of the operational amplifier,
   an inverting input terminal of the operational amplifier is coupled to a first circuit which produces a predetermined voltage, and
   the first circuit changes the predetermined voltage in accordance with a temperature of the first circuit.

10. The resistance change memory according to claim 1, further comprising a memory cell array comprising memory cells including the memory cell.

11. The resistance change memory according to claim 1, wherein the resistance change element comprises a magnetic tunnel junction (MTJ) element.

12. The resistance change memory according to claim 1 comprising at least one of a magnetoresistive random access memory (MRAM), a resistive random access memory (ReRAM) and a phase-change random access memory (PCRAM).

13. A method of determining an operation voltage of a sense amplifier in a resistance change memory, the method comprising:
    applying a clamp voltage to gates of a first transistor and a second transistor, the first transistor being coupled between a first terminal of the sense amplifier and a memory cell, the second transistor being coupled between a second terminal of the sense amplifier and a third transistor, and the memory cell comprising a resistance change element; and
    generating a reference adjustment voltage in accordance with a temperature using a reference voltage generating circuit, the reference adjustment voltage being applied to a gate of the third transistor,
    wherein the reference voltage generating circuit includes a fourth transistor having a gate coupled to the gate of the third transistor, and
    wherein the third transistor is an n-channel MOS transistor, and operates in a linear region which changes in a current value in accordance with the reference adjustment voltage.

14. The method according to claim 13, wherein the generating of the reference adjustment voltage comprises generating a first reference adjustment voltage at a first temperature, and generating a second reference adjustment voltage at a second temperature higher than the first temperature.

15. The method according to claim 13, wherein the clamp voltage is determined to be a voltage that does not cause read disturb in the memory cell.

16. The method according to claim 13, wherein the clamp voltage and the reference adjustment voltage are determined when a power supply is supplied to the resistance change memory.

17. A method of manufacturing a resistance change memory, the method comprising:
    determining a clamp voltage which is applied to gates of a first transistor and a second transistor, the first transistor being coupled between a first terminal of a sense amplifier and a memory cell, the second transistor being coupled between a second terminal of the sense amplifier and a third transistor, and the memory cell comprising a resistance change element;

determining a reference adjustment voltage which is applied to a gate of the third transistor in accordance with a temperature;

blowing fuses to produce a signal for generating the clamp voltage and the reference adjustment voltage that have been determined; and generating the reference adjustment voltage using a reference voltage generating circuit, wherein the reference voltage generating circuit includes a fourth transistor having a gate coupled to the gate of the third transistor, and wherein the third transistor is an n-channel MOS transistor, and operates in a linear region which changes in a current value in accordance with the reference adjustment voltage.

18. The method according to claim 17, wherein the determining of the reference adjustment voltage comprises determining a first reference adjustment voltage at a first temperature, and determining a second reference adjustment voltage at a second temperature higher than the first temperature.

19. The method according to claim 17, wherein the clamp voltage is determined to be a voltage that does not cause read disturb in the memory cell.

20. The method according to claim 17, wherein the clamp voltage and the reference adjustment voltage are determined when a power supply is supplied to the resistance change memory.

* * * * *